United States Patent
Watanabe et al.

(10) Patent No.: US 7,084,549 B2
(45) Date of Patent: Aug. 1, 2006

(54) DRIVER OF PIEZOELECTRIC ACTUATOR

(75) Inventors: Kazuhisa Watanabe, Fujimi (JP); Satoshi Enomoto, Higashimatsuyama (JP); Hiroshi Enomoto, Higashimatsuyama (JP)

(73) Assignees: WAC Data Service Co., L td., Fujimi (JP); CDK Co., Ltd., Higashimatuyama (JP)

( * ) Notice: Subject to any disclaimer, the term of this patent is extended or adjusted under 35 U.S.C. 154(b) by 0 days.

(21) Appl. No.: 10/529,594

(22) PCT Filed: Oct. 14, 2003

(86) PCT No.: PCT/JP03/13110

§ 371 (c)(1),
(2), (4) Date: May 26, 2005

(87) PCT Pub. No.: WO2004/036729

PCT Pub. Date: Apr. 29, 2004

(65) Prior Publication Data

US 2005/0231321 A1   Oct. 20, 2005

(30) Foreign Application Priority Data

Oct. 16, 2002  (JP) .............................. 2002-301461

(51) Int. Cl.
*H01L 41/09* (2006.01)
(52) U.S. Cl. ..................................... 310/317
(58) Field of Classification Search ................ 310/317, 310/316.01–316.03
See application file for complete search history.

(56) References Cited

U.S. PATENT DOCUMENTS 4,939,401 A * 7/1990 Farrall ........................ 310/317

2001/0035697 A1* 11/2001 Rueger et al. ......... 310/316.03
2002/0096970 A1* 7/2002 Hayashi et al. ........ 310/316.02

FOREIGN PATENT DOCUMENTS

JP       4-039060        2/1992
JP       5-302251    *  11/1993

(Continued)

OTHER PUBLICATIONS

Randy H. Katz, Contemporary Logic Design, 1994, The Benjamin/Cummings Publishing Company Inc., pp. 152,201,542-543, 667.*

*Primary Examiner*—Thomas M. Dougherty
(74) *Attorney, Agent, or Firm*—Foley & Lardner LLP

(57) ABSTRACT

To make it possible to sustain a low power consumption for the entire driver in a driver of a piezoelectric actuator, by reducing the number of components and switching the piezoelectric actuator at a high speed. Common resistors Ra and Rb for current limitation are interposed at some midpoint of the feeder lines 19 and 21. Phototransistors Q1 to Q8 are connected to the power source side of the common resistors Ra and Rb of the feeder lines 19 and 21. Piezoelectric actuators 1a to 1h are connected to terminals Sa and Sb of the common resistors Ra and Rb on the side opposite to the power supply section, and to the joints of the phototransistors Q1 to Q8. Light emitting diodes D1 to D8 are disposed in proximity to the phototransistors Q1 to Q8, and the light emitting diodes D1 to D8 are switched and conducted at a switching control section 25. The switching control section 25 overlaps conduction control of the light emitting diodes D1 to D8 corresponding to the next piezoelectric actuators 1a to 1h, after the 70% charged state of the piezoelectric actuators 1a to 1h in association with the on-operation of the piezoelectric actuators 1a to 1h.

9 Claims, 7 Drawing Sheets

FOREIGN PATENT DOCUMENTS

| | | |
|---|---|---|
| JP | 5-302251 A | 11/1993 |
| JP | 7-141028 A | 6/1995 |
| JP | 8-218255 A | 8/1996 |
| JP | 10-000773 A | 1/1998 |
| JP | 2002-113864 | 4/2002 |
| JP | 2002-217462 A | 8/2002 |

* cited by examiner

DRIVER OF PIEZOELECTRIC ACTUATOR

TECHNICAL FIELD

The present invention relates to a driver of a piezoelectric actuator, and particularly to improvement in the driver of the piezoelectric actuator for driving a plurality of piezoelectric actuators mechanically moving each of the plural mechanism components directly or indirectly installed on the driver, by switching them.

BACKGROUND ART

Conventionally, as shown in FIG. 5, a piezoelectric actuator 1 is constituted in such a manner that thin piezoelectric plates 5 and 7 are stuck to opposing faces of rectangular conductive plates 3, and electrodes 5a and 7a are disposed on the opposing faces which are not brought into contact with the plates 3 in each piezoelectric plate 5, with the plates 3 serving as common electrodes, and while supporting one end (left end in the figure) in the longitudinal directions of the plates 3 in an open-sided shape, the other end (right end in the figure) is formed in an open end. Note that a support member of the piezoelectric actuator 1 is not shown in FIG. 5 (see FIG. 6).

In the piezoelectric actuator 1, for example, when positive potential+is applied between a positive terminal P1 and a common terminal P3 (between the electrode 5a of the piezoelectric plate 5 and the plate 3) according to the polarization directions of the piezoelectric plates 5 and 7, for example, the plate 3 is bent so that the open end is displaced in the upward direction as shown by broken line in FIG. 5.

Meanwhile, when a negative potential—is applied between the common terminal P3 and a negative terminal P2 (between the plate 3 and the electrode 7a of the other piezoelectric plate 7), for example, the open end is displaced in the downward direction as shown by one-dot chain line in the figure.

Then, the piezoelectric actuator 1 is used as various driving sources, such as a needle selecting driver of knitting needles of a knitting machine, by utilizing a bending motion by dint of such a piezoelectric phenomenon.

Specifically, as shown in FIG. 6, the aforementioned plural piezoelectric actuators 1 (shown by dividing into 1a, 1b, 1c, 1d, 1e, 1f, 1g, and 1h in the figure) are arranged on a side wall 9a in a long and narrow insulating box-shaped case 9 in parallel to each other at prescribed intervals apart from one another, with the one end supported in an open-sided shape and the other end as the open end inserted into operation holes 11 formed on the side wall 9b opposing to the side wall 9a in the case 9 with a certain play. Then, operation pieces 13 as mechanical components fixed to the other ends are protruded with a certain play from the operation holes 11.

A plurality of piezoelectric actuators 1a to 1h (including the operation pieces 13) supported by the case 9 are the same actuators, and FIG. 7 is a view of the case 9 viewed from the side of the side wall 9b of the case 9, specifically from tip end sides of the operation pieces 13.

When a positive/negative direct current drive voltage is applied from a power supply section 15 to such plural piezoelectric actuators 1a to 1h through a controller 17, each of the piezoelectric actuators 1a to 1h is bent and the operation pieces 13 protruding from the operation holes 11 of the case 9 are displaced. This contributes to moving a selecting needle lever not shown (mechanism component) by the operation pieces 13.

Then, when the controller 17 switches and selects the drive voltage applied to the plural piezoelectric actuators 1a to 1h, the piezoelectric actuators 1a to 1h can be used as a needle selecting driver of the knitting needles of the knitting machine, for example.

A general patent document according to such a kind of piezoelectric actuator includes a patent document 1 (Japanese Patent Laid Open No.5-302251).

Further, the structure as shown in FIG. 8 is given as an example of the structure of controlling the drive voltage applied to the plural piezoelectric actuators 1a to 1h by the controller 17.

Specifically, phototransistors Q1 and Q2, Q3 and Q4, Q5 and Q6, Q7 and Q8, which are connected in series respectively, are disposed corresponding to the plural piezoelectric actuators 1a to 1h. A collector of one of the phototransistors Q1 is connected to phototransistors Q1 and Q2 through a resistor R1 from a positive side feeder line 19, and an emitter of the other phototransistor Q2 is connected to a negative side feeder line 21 through a resistor R2.

The positive terminal P1 in the piezoelectric actuator 1a is connected to the positive side feeder line 19, the negative terminal P2 is connected to the negative side feeder line 21, and joints of the phototransistors Q1 and Q2 are connected to common terminal P3 of the piezoelectric actuator 1a.

Similarly, the phototransistors Q3 to Q8 are also connected to the positive side and negative side feeder lines 19 and 21 through resistors R3 to R8, and the piezoelectric actuators 1b to 1d are also connected to the joints of the phototransistors Q3 to Q8 and the positive side and negative side feeder lines 19 and 21.

In addition, light emitting diodes D1 and D2, D3 and D4, D5 and D6, and D7 and D8 are disposed in proximity to and corresponding to the photo transistors Q1 and Q2, Q3 and Q4, Q5 and Q6, and Q7 and Q8 connected in series.

The light emitting diodes D1 to D8 are emitted by selectively energizing by a switching control section 23, and the driver of the aforementioned piezoelectric actuators is thereby formed.

In FIG. 8, the aforementioned controller 17 is formed by the phototransistors Q1 to Q8, light emitting diodes D1 to D8, and the switching control section 23.

Note that in FIG. 8, the light emitting diodes D1 to D8 are connected by one line from the switching control section 23. However, actually the light emitting diodes D1 to D8 are connected by individual wiring corresponding to the light emitting diodes D1 to D8. Such wiring is simplified in FIG. 8 so as to be easy to understand.

Then, for example, when the piezoelectric actuator 1a out of the plural piezoelectric actuators 1a to 1d is on-operated, the open end is displaced in the upward direction through the conduction control of only light emitting diode D1 selectively by the switching control section 23. Meanwhile, the tip end is displaced in the downward direction through the conduction control of only light emitting diode D2 selectively.

Similarly, in the other piezoelectric actuators 1b to 1d also, the tip end is displaced through the conduction control of only either of the light emitting diodes D3 or D4, D5 or D6, and D7 or D8.

In the driver of the piezoelectric actuators thus constituted, the resistors R1 to R8 connected between the phototransistors Q1 to Q8 and the positive side and negative side feeder lines 19 and 21 have a current limit function to suppress a drive current flowing through the phototransistors Q1 to Q8 so as not to increase the power consumption for the entire driver due to increased drive current, which occurs when one of the phototransistors is switched to the other in the phototransistors Q1 and Q2, Q3 and Q4, Q5 and Q6, and Q7 and Q8, thereby causing both of the phototransistors Q1 and Q2, Q3 and Q4, Q5 and Q6, and Q7 and Q8 to be temporarily conducted or a rapid current change to occur, resulting in a large drive current.

However, in the driver of the aforementioned piezoelectric actuators, the resistors R1 to R8 for current limitation are connected to the plural phototransistors Q1 to Q8 to on-drive the plural piezoelectric actuators 1a to 1h. Therefore, the number of components is increased, the wiring is complicated, a cost is difficult to be reduced, and productivity is also difficult to be improved.

In such a condition, it is considered that if the resistors for current limitation are inserted in the parts up to the controller 17 one by one in the positive side and negative side feeder lines 19 and 21, the number of components is reduced, and the wiring is simplified. However, this is not realized for the reason described hereunder.

More specifically, in the piezoelectric actuators 1a to 1h of this kind used for the needle selecting driver of the knitting needle of the knitting machine or the like, a quick switching speed allows the knitting needle to be quickly displaced, thereby increasing a knitting speed.

For example, when the piezoelectric actuator 1a is on-controlled and another piezoelectric actuator 1b is on-controlled at the same time or immediately following, or when the piezoelectric actuators 1a to 1h are sequentially on/off controlled while on/off operation switching timing is reduced, a large drive current flows temporarily. Under such a situation, if one or a pair of resistors R for current limitation are provided, heat generation is apt to be large.

In order to avert above-described situation, a large power consumption and an expensive resistor are needed, and consequently, inexpensive resistors R1 to R8 with low power consumption are inserted and connected for each of the piezoelectric actuators 1a to 1h.

The inventors of the present invention carefully study on the function and an equivalent circuit of the piezoelectric actuators 1a to 1h. As a result, the inventors of the present invention focus on the point that the piezoelectric actuators 1a to 1h have a function as capacitors equivalently, and the drive current flowing through the piezoelectric actuators 1a to 1h is reduced in accordance with the progress of charging operation, although large immediately after the on-control, and after a specified period has passed, the drive current becomes very small, and the change with the lapse of time is small. Consequently it is found that the number of the resistors is reduced and the piezoelectric actuators 1a to 1h can be switched at a high speed, and the present invention is thus completed.

In order to solve the above-described problem, an object of the present invention is to provide a driver of a piezoelectric actuator capable of reducing in the number of resistors suppressing increase in a drive current and switching plural piezoelectric actuators at a high speed and sustaining low power consumption for the entire driver in the driver for driving the plural piezoelectric actuators.

DISCLOSURE OF THE INVENTION

In order to solve the aforementioned problem, the present invention provides the plural actuators in which the piezoelectric plates are stuck to the plates, comprising:

plural actuators mechanically moving a mechanical component directly or indirectly connected to each of the piezoelectric actuators;

feeder lines extending from a power supply section for applying a drive voltage to the piezoelectric plate of each of the piezoelectric actuators;

common resistors connected to the feeder lines in series for current limitation limiting the drive current to the piezoelectric plate of the piezoelectric actuators to a prescribed range; and a controller sequentially selectively on-controlling the drive voltage applied to the piezoelectric plate of each of the piezoelectric actuators by the feeder lines.

In addition, the plural piezoelectric actuators are connected to the feeder lines of the common resistors on the side opposite to the power supply section, and the controller has a function to on-control the drive voltage to be applied to the piezoelectric plate of the piezoelectric actuator to be driven next, after the piezoelectric plate of the piezoelectric actuator, to which the drive voltage is applied, is put into a 60% or more charged state.

Further, according to the present invention, the controller can also have the function to on-control the drive voltage to be applied to the piezoelectric plate of the piezoelectric actuator to be driven next, during applying the drive voltage to the piezoelectric plate of the piezoelectric actuator to which the drive voltage is applied.

Also, according to the present invention, preferably, the controller is connected to the power section side of the common resistors, and the drive voltage applied to the piezoelectric plates of piezoelectric actuators is on-controlled.

BEST MODES FOR CARRYING OUT THE INVENTION

Embodiments of the present invention will be explained with reference to the drawings of the present invention hereunder. Note that the parts identical to those in the conventional example are assigned the same numerals without further explanation.

Figure 1:
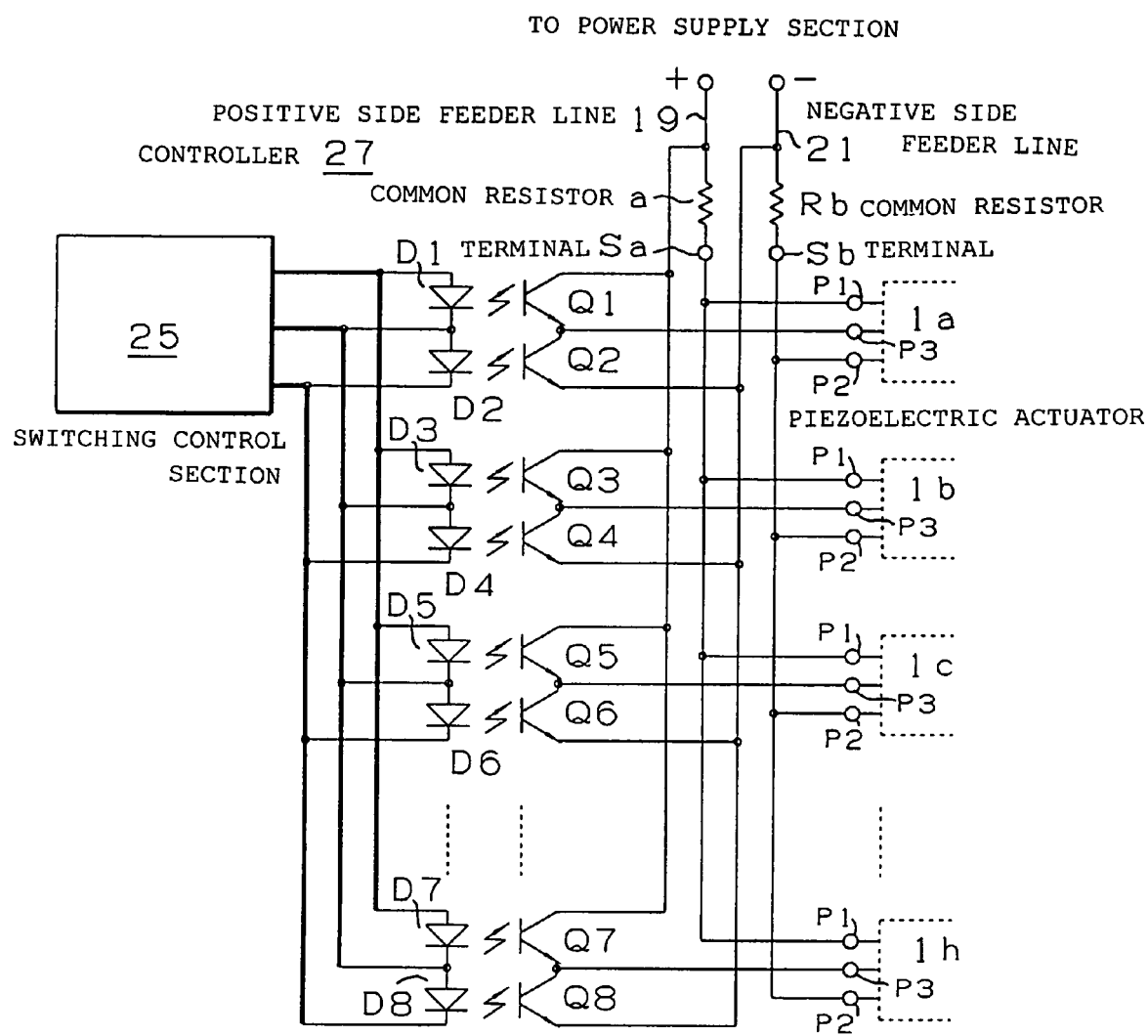
FIG. 1 is a block circuit diagram showing an embodiment relating to a driver of a piezoelectric actuator according to the present invention.

FIG. 1 is a block diagram showing an embodiment relating to a driver of a piezoelectric actuator according to the present invention.

Figure 5:
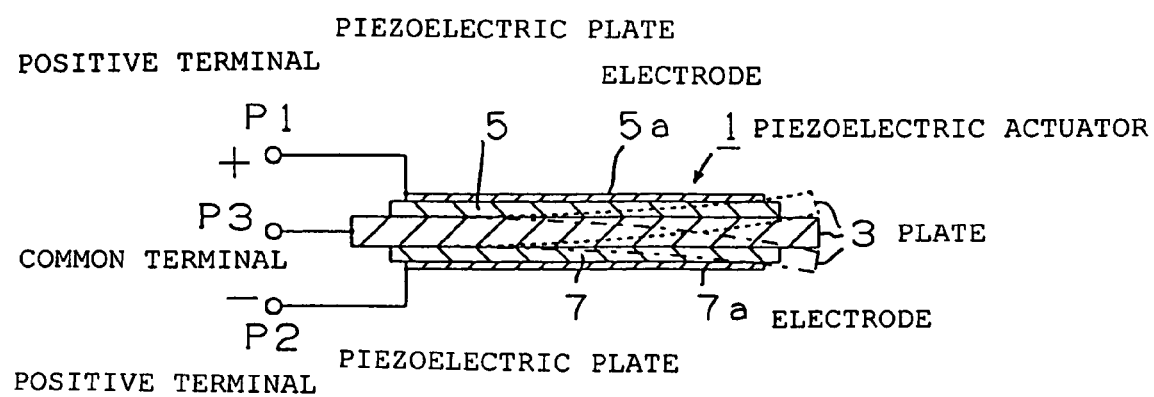
FIG. 5 is a sectional view showing a general configuration of the piezoelectric actuator.
Figure 6:
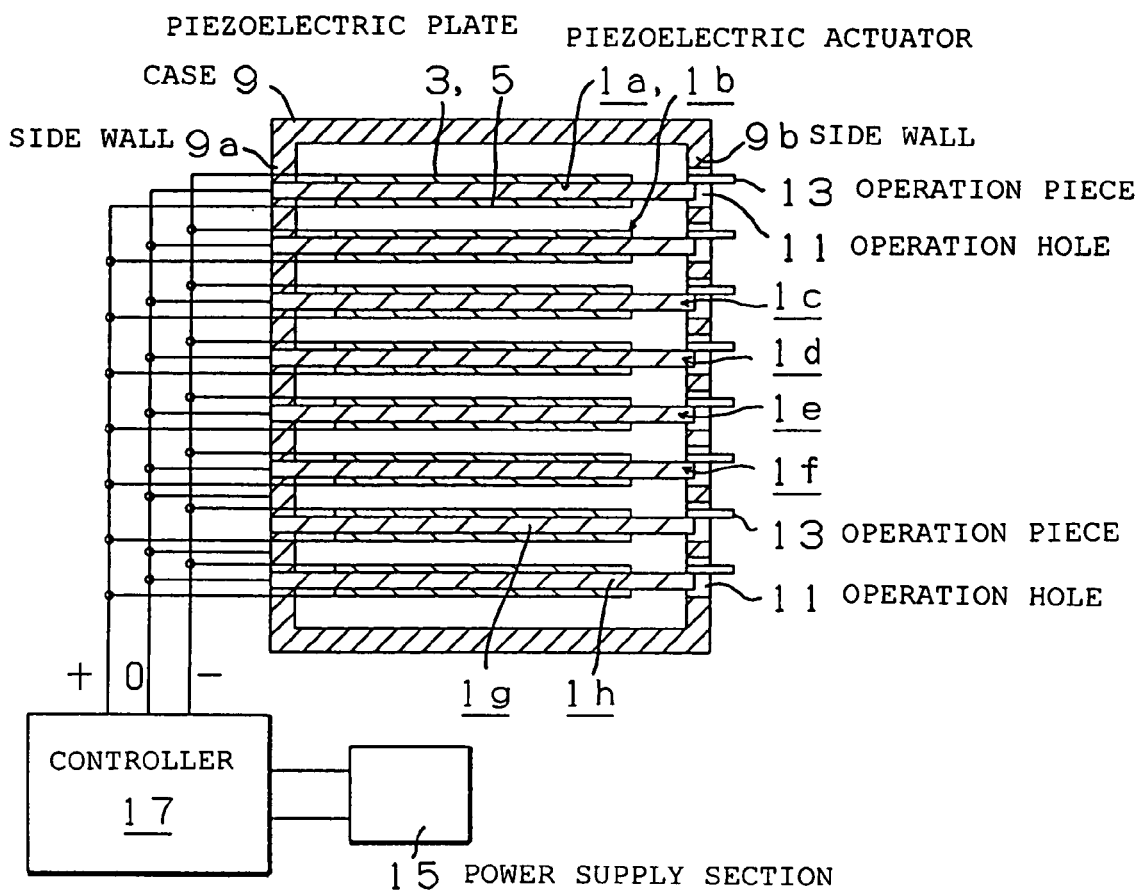
FIG. 6 is a sectional view showing a configuration example utilizing the piezoelectric actuator.
Figure 7:
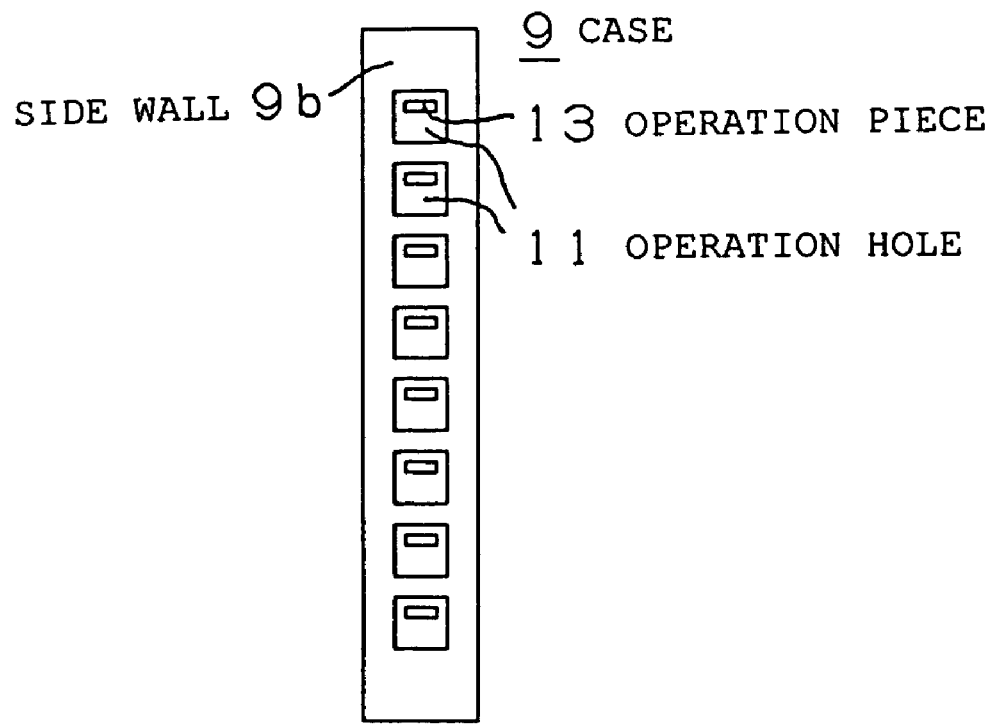
FIG. 7 is a side view of an essential part of FIG. 6.

In FIG. 1, plural piezoelectric actuators 1a, 1b, 1c, 1d, 1e, 1f, 1g, and 1h are constituted, as shown in FIG. 5 for example, by piezoelectric plates 5 and 7 stuck to opposing faces of the conductive plates 3, and electrodes 5a and 7a disposed on the opposing faces which are not brought into contact with the plate 3 of each of the piezoelectric plates 5 and 7, with the plates 3 serving as common electrodes of each of the piezoelectric plates 5 and 7, and as shown in FIG. 6, supported by a box-shaped case 9 (not shown in FIG. 1) in an open-sided shape.

Note that in FIG. 1, the piezoelectric actuators 1d to 1g are not shown, however they are formed in the same way as the piezoelectric actuators 1a, 1b, and 1c.

As shown in FIG. 6, a positive side feeder line 19 and a negative side feeder line 21 are extended from a power supply section 15, serving as lines to supply a positive DC power source of about +50V to +100 V, and a negative DC power source of about −50V to −100V, with common resistors Ra and Rb for current limitation inserted and connected in series in the middle thereof.

Phototransistors Q1 and Q2, Q3 and Q4, Q5 and Q6, and Q7 and Q8 in which emitters and collectors are mutually connected in series, are disposed corresponding to the piezoelectric actuators 1a to 1h.

Each collector of each of the phototransistors Q1, Q3, Q5, and Q7 is directly connected to the positive side feeder line 19 on the side of the power supply section of the common resistor Ra, not through the common resistor Ra.

Each emitter of the phototransistors Q2, Q4, Q6, and Q8 is connected to the negative side feeder line 21 on the side of the power supply section of the common resistor Rb.

Joints of the phototransistors Q1 and Q2, Q3 and Q4, and Q7 and Q8 are connected to common terminals P3 of the piezoelectric actuators 1a, 1b, 1c, to 1h.

Positive terminals P1 of the piezoelectric actuators 1a, 1b, 1c, to 1h are connected to terminal Sa of the common resistor Ra of the positive side feeder line 19 on the side opposite to the power supply section, and negative terminals P2 of the piezoelectric actuators 1a, 1b, 1c to 1h are connected to a terminal Sb of the common resistor Rb of the negative side feeder line 21 on the side opposite to the power supply section.

Light emitting diodes D1 and D2, D3 and D4, D5 and D6, and D7 and D8 are sequentially connected in series.

The light emitting diode D1 and the phototransistor Q1, the light emitting diode D2 and the phototransistor Q2, the light emitting diode D3 and the phototransistor Q3, the light emitting diode D4 and phototransistor Q4, the light emitting diode D5 and phototransistor Q5, the light emitting diode D6 and the phototransistor Q6, the light emitting diode D7 and the phototransistor Q7, and the light emitting diode D8 and the phototransistor Q8, are correspondingly disposed in proximity to each other, respectively.

The light emitting diodes D1 and D2, D3 and D4, D5 and D6, and D7 and D8 are connected to a switching control section 25. Then, by this switching control section 25, any one of the light emitting diodes D1 to D8 is switched and conducted to emit light.

Figure 8:
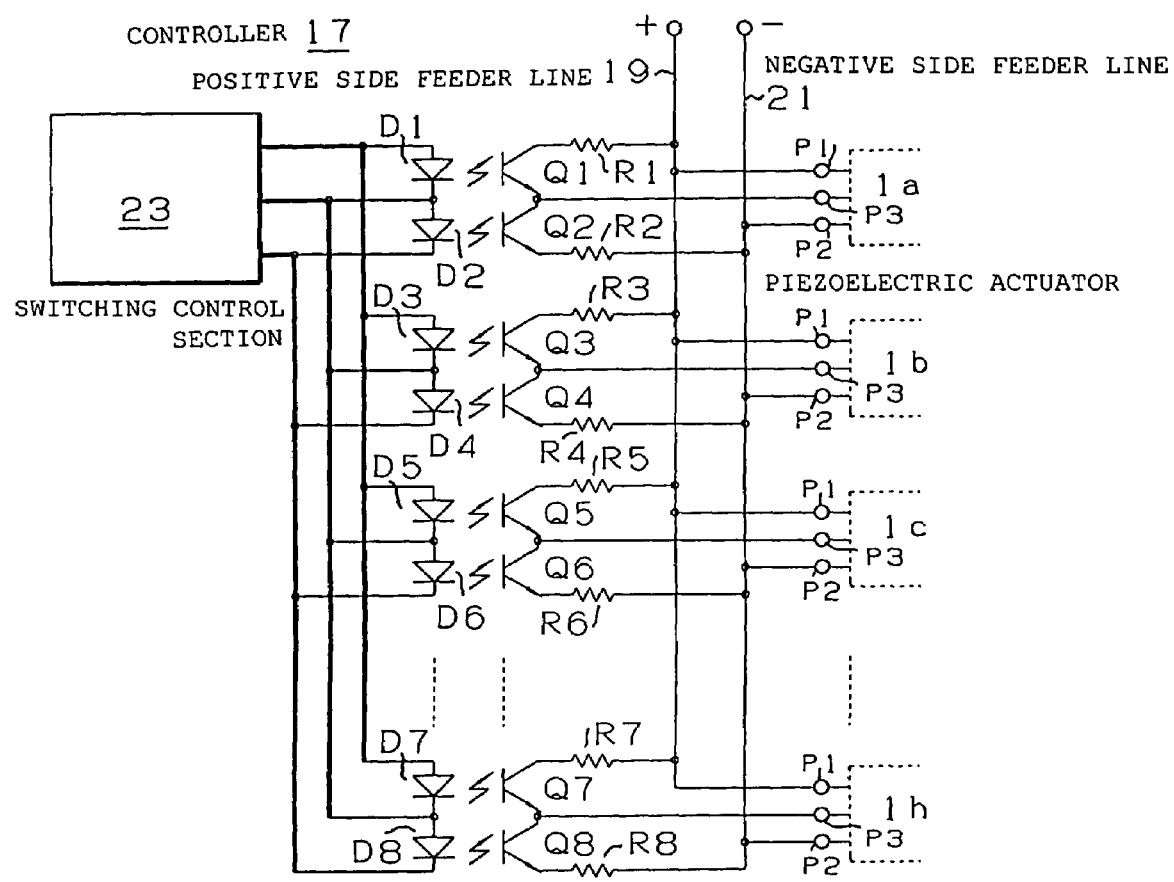
FIG. 8 is a block circuit diagram showing the driver of the conventional piezoelectric actuator.

Note that in FIG. 1 also, the light emitting diodes D1 to D8 are connected by one line from the switching control section 25. However, in the same way as explained in FIG. 8, actually the light emitting diodes D1 to D8 are connected by individual wiring corresponding to the light emitting diodes D1 and D2, D3 and D4, D5 and D6, and D7 and D8, thereby performing emission control by selecting any one of the light emitting diodes D1 to D8, in the same way as shown in FIG. 8.

For example, when only light emitting diode D1 is selectively switched and conducted at the switching control section 25, the phototransistor Q1 is on-operated by receiving the light from the light emitting diode D1, and the positive drive current is applied to both sides of the piezoelectric plate 5 (not shown in FIG. 1) of the piezoelectric actuator 1a. Meanwhile, the negative drive voltage is applied to both sides of the piezoelectric plate 7 (not shown in FIG. 1) of the piezoelectric actuator 1a which is thereby charged, and the open end thereof (operation piece 13) is thereby displaced in the upward direction.

When the light emitting diodes D1 and D3 are selectively switched and conducted at the switching control section 25, the phototransistors Q1 and Q3 are on-operated, and the open ends (operation pieces 13) of the piezoelectric actuators 1a and 1b are displaced in the upward direction.

Then, the plural light emitting diodes D1 to D8 are sequentially selectively controlled and conducted at the switching control section 25.

Figures 2, 3:
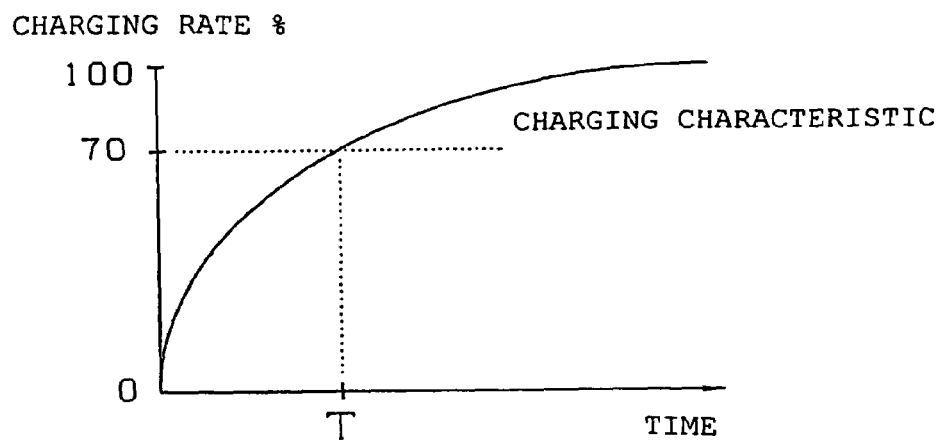
FIG. 2 is a view showing an example of a charging characteristic of the piezoelectric actuator.
FIG. 3 is a waveform chart explaining a switching operation of the driver of the piezoelectric actuator according to the present invention.

More specifically, for example, as shown in FIG. 3, the switching control section 25 functions to on-control the drive voltage application, so that the drive voltage is applied to the plural piezoelectric actuators 1a to 1h in such a manner that the drive voltage is applied to the piezoelectric actuator 1a, subsequently applied to the piezoelectric actuator 1b, and then applied to 1c to 1h in this order.

Further, when the piezoelectric actuator 1a (correctly piezoelectric plates 5 and 7) is put into 70% charged state, the drive voltage applied to the next piezoelectric actuator 1b is on-controlled, and when the drive voltage applied to the piezoelectric actuator 1b is put into the 70% charged state, the drive voltage applied to the next piezoelectric actuator 1c is further on-controlled. Thereafter onward, the control of the drive voltage is sequentially repeated.

FIG. 2 shows a change of charging with lapse of time, wherein when the drive voltage is applied to each of the piezoelectric actuators 1a to 1h up to the point T of 70% charged state, the drive voltage is controlled and started to be applied to the next piezoelectric actuators 1a to 1h.

After the lapse of time (for example, 200μ seconds) of applying the drive voltage to each of the piezoelectric actuators 1a to 1h, individual or all drive voltage is off-controlled at the switching control section 25.

Accordingly, each of the piezoelectric actuators 1a to 1h is designed so that the switching control section 25 overlaps conduction control of each piezoelectric actuator 1a to 1h sequentially during the time period from the drive voltage is put into the 70% charged state until the application of the drive voltage is off-controlled, and the piezoelectric actuators 1a to 1h are increased through such overlapped conduction control.

The designation mark 27 in FIG. 1 indicates the controller constituted of the aforementioned phototransistors Q1 to Q8, the light emitting diodes D1 to D8, and the switching control section 25, the switching control section 25 having the function to selectively switch and control the drive voltage applied to the piezoelectric plate of each of the piezoelectric actuators 1a to 1h sequentially from the feeder lines 19 and 21.

Next, brief explanation will be given to the driver of the piezoelectric actuators thus constructed, in a case of on-operating the piezoelectric actuators 1a to 1h sequentially in this order, for example.

When the switching control section 25 selectively performs the conduction control of only light emitting diode D1, the phototransistor Q1 is on-operated, and the positive side drive voltage is applied from the feeder line 19 to the piezoelectric actuator 1a through the common resistor Ra, and the open end thereof is displaced in the upward direction.

The switching control section 25 performs the conduction control of the light emitting diode D3 also after the 70% charged state of the piezoelectric actuator 1a, and the phototransistor Q3 is thereby on-operated.

Therefore, the positive side drive voltage is applied from the feeder line 19 to the piezoelectric actuator 1b through the common resistor Ra, and the open end thereof is also displaced in the upward direction.

In this case, as shown in FIG. 3, at operation start time of the piezoelectric actuator 1b, which is bend-driven after delay, the bend-drive of the piezoelectric actuator 1a previously started operating is also going on.

When the piezoelectric actuator 1b is put into the 70% charged state, the conduction of the light emitting diode D5 is on-controlled at the switching control section 25 and the phototransistor Q5 is off-operated, the piezoelectric actuator 1c is also bend-driven in an overlapping manner. Thereafter, this process is repeated.

In this way, the driver of the piezoelectric actuator of the present invention is constituted by inserting and connecting the common resistors Ra and Rb for current limitation in series at some mid point of the positive side and the negative side feeder lines 19 and 21, connecting one end of the phototransistors Q1, Q3, Q5, and Q7 to the power supply section side of the common resistor Ra of the positive side feeder line 19, and connecting one end of the phototransistors Q2, Q4, Q6, and Q8 to the power supply section side of the common resistor Rb of the negative side feeder line 21 out of the phototransistors Q1 and Q2, Q3 and Q4, Q5 and Q6, Q7 and Q8 connected in series corresponding to the plural piezoelectric actuators 1a to 1h, and connecting the common terminals P3 of the piezoelectric actuators 1a, 1b, 1c to 1h to the joints of the phototransistors Q1 and Q2, Q3 and Q4, Q5 and Q6, Q7 and Q8, and further connecting the positive terminal P1 and the negative terminal P2 to the positive side and the negative side feeder lines 19 and 21 through the terminals Sa and Sb of the common resistor Ra on the side opposite to the power supply section.

Then, the light emitting diodes D1 to D8 are disposed in proximity to the phototransistors Q1 to Q8 corresponding thereto. Particularly, the switching control section 25 has the function to conduction control of any one of the light emitting diodes D1 to D8 to control the drive voltage to be applied to the corresponding piezoelectric actuators 1a to 1h, and overlap conduction control of the light emitting diodes D1 to D8 corresponding to the next piezoelectric actuators 1a to 1h after the 70% charged state of the piezoelectric actuators 1a to 1h, to which the drive voltage is applied.

Therefore, the start time, at which the drive voltage is applied to the plural piezoelectric actuator 1a to 1h, is sequentially delayed. Then, the period, during which the drive current of each of the piezoelectric actuators 1a to 1h becomes large, is averted, and the drive voltage is applied to the next piezoelectric actuators 1a to 1h, with the drive current reduced to a very small current that can be ignored.

Thus, the entire drive current is difficult to be increased, and the resistors R1 to R8 for current limitation inserted for each piezoelectric actuators 1a to 1d, can be reduced to a pair of common resistors Ra and Rb, and the wiring is simplified, thereby easy to reduce the cost, and productivity is also improved.

Also, under the on-control state of a part of the piezoelectric actuators out of the plural piezoelectric actuators 1a to 1h, the on-control of the piezoelectric actuator 1b to be on-controlled next becomes possible.

Therefore, while on-operation switch timing is reduced, the piezoelectric actuators 1a to 1h are sequentially on-controlled, thus increasing the operating speed of the plural piezoelectric actuators 1a to 1h in entirety, and improving the knitting speed of the knitting needles of the knitting machine. In addition, the power consumption of the entire driver is hardly increased.

Specifically, the driver of the piezoelectric actuator of the present invention is capable of reducing the cost and improving the productivity through reducing the number of components and simplification of the wiring, and also realizing the increase in the switching operation speed of the plural piezoelectric actuators 1a to 1h.

Further, with the structure as described above, when switching between the positive drive voltage and the negative drive voltage in each of the piezoelectric actuators 1a to 1h, charging has already progressed in large quantity, to make it difficult that a large drive current flows temporarily. Therefore, increase in the current in switching can be effectively suppressed by the common resistors Ra and Rb pair.

In addition, in this invention, the switching operation timing of the plural piezoelectric actuators 1a to 1h by the controller 17 is not limited to the point after the 70% charged state of the piezoelectric actuators 1a to 1h, but can be changed.

More specifically, when start of application of the drive voltage to the piezoelectric actuators to be on-controlled next is after the piezoelectric plates of the piezoelectric actuators 1a to 1h are put into 70% charged state, the start of the application of the drive voltage can be changed to the charging completion point where the piezoelectric plates are put into 80% charged state, for example. Therefore, the switching control section 25 (controller 17) may be formed in accordance with the change in the switching operation timing.

A charging rate to the piezoelectric plate is the timing of on-controlling one of the piezoelectric actuators 1a to 1h while on-controlling any one of the piezoelectric actuators 1a to 1h, in which the drive current to each of the plural piezoelectric actuators 1a to 1h becomes maximum immediately after the drive voltage is applied and is thereafter transiently and drastically reduced. Therefore, even if the charging rate is 60% or more, the object of the present invention can be achieved.

However, from the viewpoint of securing a stable operation without increasing the power consumption so much, preferably the charging rate is set to be larger than 60%, that is, set to beyond 70%, and the timing to change in this state can be changed. Therefore, the switching control section 25 may be formed in accordance with the change in the switching operation timing.

Figure 4:
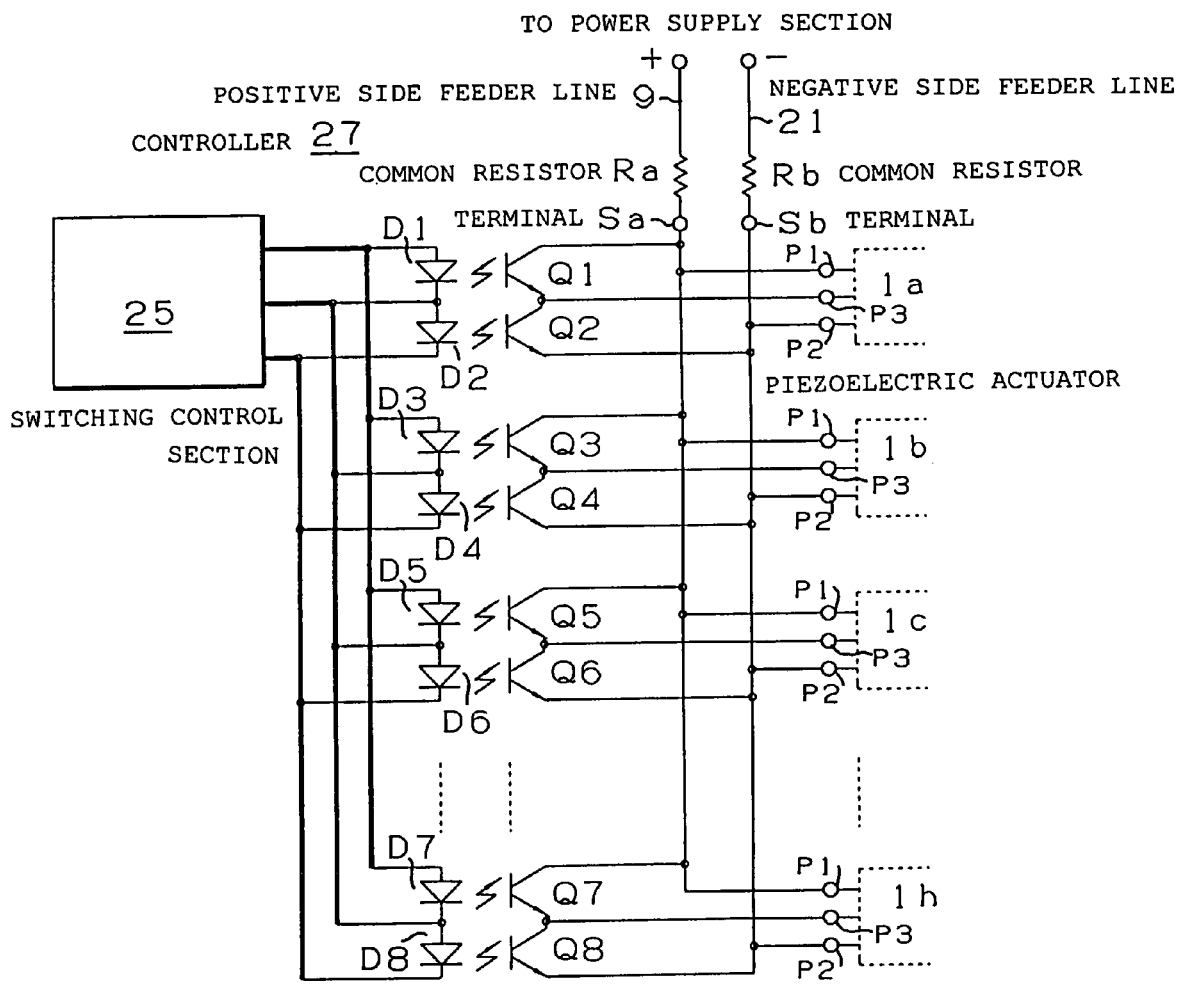
FIG. 4 is a block circuit diagram showing other embodiment relating to the driver of the piezoelectric actuator according to the present invention.

Incidentally, as shown in FIG. 4, the driver of the piezoelectric actuator according to the present invention may be constituted by connecting the phototransistors Q1, Q3, Q5, and Q7 to the positive side feeder line 19 through the terminal Sa of the common resistor Rb on the side opposite to the power supply section, and the phototransistors Q2, Q4, Q6, and Q8 are connected to negative side feeder line 21 through the terminal Sb of the common resistor Rb on the side opposite to the power supply section. Other structure is similar to that of FIG. 1, and the same effect can be obtained.

Incidentally, as described above, if the phototransistors Q1 to Q8 are connected to the power supply section side of the common resistors Ra and Rb in the positive side and the negative side feeder lines 19 and 21, influence of variation of power supply voltage on the phototransistors Q1 to Q8 is reduced at switching the phototransistors Q1 to Q8 (piezoelectric actuators 1a to 1h), thereby facilitating a stable operation.

In addition, in the present invention, the piezoelectric actuator, to which the drive voltage is applied and controlled, can be changed even after switching the drive power supply in an off-state.

Particularly, in the uniform piezoelectric actuators 1a to 1h, the positive drive voltage and the negative drive voltage are switched, and the uniform piezoelectric actuators 1a to 1h are bent and displaced in a vertical direction. In this structure, the phototransistors Q1 and Q2, Q3 and Q4, Q5 and Q6, and Q7 and Q8 connected in series are put into the on-state at switching, and a large drive current is easily flows.

In order to suppress the aforementioned situation, it is necessary to apply the drive voltage of reverse potential after the positive and the negative drive voltage sufficiently drop by the off-operation. From this viewpoint, it is effective to drive the power source after switched in the off-state.

The aforementioned each of the piezoelectric actuators 1a to 1h is arbitrarily constituted, and for example, may be composed of only piezoelectric plates 3 and 5, or may have plural piezoelectric plates 3 and 5 and the plates may be laminated, and also the supporting body is not limited to the constitution of the aforementioned case 9.

According to the present invention, the switching mechanism of the controller 27 for switching the drive power source from the feeder lines to the plural piezoelectric actuators 1a to 1h, is not limited to the aforementioned combination of the light emitting diodes D1 to D8 and the phototransistors Q1 to Q8, but may be a contactless switch by only transistor for turning on and off the power source, and the switching control section 25 may be formed in accordance with the switching mechanism.

Note that when the light emitting diodes D1 to D8 are combined with the phototransistors Q1 to Q8, an insulating state between the feeder lines 19, 21, and the controller 17 side is easily formed and a stable operation can thereby be realized.

Further, the power supply section 15 may also be arbitrarily constituted, may be constituted requiring both of positive voltage and negative voltage, and may also be formed requiring either of the positive voltage or the negative voltage to drive.

As described above, the present invention comprises:

plural piezoelectric actuators in which piezoelectric plates are stuck to plates;

a feeder line extending from a power supply section for applying a drive voltage to the piezoelectric plate of each of the piezoelectric actuators;

a common resistor for current limitation connected in series to the feeder line and limiting a drive current applied to the plural piezoelectric actuators to a prescribed range; and a controller selectively and sequentially on-controlling the drive voltage to be applied to each of the plural piezoelectric actuators from the feeder line, wherein each of the piezoelectric actuators is connected to feeder line of the common resistor on the side opposite to the power supply section, and the controller has a function to on-control the drive voltage to be applied to the piezoelectric plate of the piezoelectric actuator to be driven next, after the piezoelectric plate of the piezoelectric actuator, to which the drive voltage is applied, is put into a 60% or more charged state.

Therefore, the driver of the piezoelectric actuator of the present invention has advantages of reducing the cost and improving the productivity through reducing the number of components and simplification of wiring, and realizing the increase in the switching operation speed of the plural piezoelectric actuators, and also reducing the power consumption for the entire driver.

In addition, when the controller has the function to on-control the drive voltage to be applied to the piezoelectric actuator to be driven next, during applying the drive voltage to any one of the piezoelectric actuators, to which the drive voltage is applied, the switching speed of the plural piezoelectric actuators is further increased.

Further, the controller is connected to the power supply section side of the common resistors, and the drive voltage applied to the piezoelectric plate of the piezoelectric actuator is on-controlled. In this constitution, the controller is hardly affected by fluctuations in power supply voltage at switching to the drive voltage applied to the piezoelectric plate of the piezoelectric actuator, thus facilitating a stable operation of the controller.

INDUSTRIAL APPLICABILITY

The driver of the piezoelectric actuator according to the present invention is not limited to the driver for driving the knitting needles of the knitting machine as described above, but applicable as a drive source mechanically moving a mechanical component directly or indirectly connected to each of the plural piezoelectric actuators having piezoelectric plates, such as an ink jet drive source and a dot wire drive source in a printer.

The invention claimed is:

1. A driver of a piezoelectric actuator in which a piezoelectric plate is stuck to a plate, comprising:

plural piezoelectric actuators mechanically moving a mechanical component directly or indirectly connected to each of the piezoelectric actuators;

a feeder line extending from a power supply section for applying a drive voltage to the piezoelectric plate of each of the piezoelectric actuators;

a common resistor connected to the feeder line in series, for current limitation limiting a drive current to the piezoelectric plate of each of the piezoelectric actuators to a prescribed range; and a controller selectively and sequentially on-controlling the drive voltage to be applied to each of the piezoelectric actuators by the feeder line, wherein each of the piezoelectric actuators is connected to the feeder line of the common resistor on the side opposite to the power supply section, and the controller has a function to on-control the drive voltage to be applied to the piezoelectric plate of the piezoelectric actuator to be driven next, after the piezoelectric plate of the piezoelectric actuator, to which the drive voltage is applied, is put into a 60% charged state during applying the drive voltage to the piezoelectric plate of the piezoelectric actuator.

2. The driver of the piezoelectric actuator according to claim 1, wherein the controller is connected to the power supply section side of the common resistor, and has a function to on-control the drive voltage applied to the piezoelectric plate of the piezoelectric actuator.

3. The driver of the piezoelectric actuator according to claim 1, wherein the controller includes a switching mechanism for switching the drive voltage.

4. The driver of the piezoelectric actuator according to claim 3, wherein the switching mechanism includes a plurality of light emitting diodes and a plurality of phototransistors.

5. The driver of the piezoelectric actuator according to claim 4, wherein emitters and collectors of the plurality of phototransistors are mutually connected in series and disposed corresponding to the plurality of piezoelectric actuators.

6. The driver of the piezoelectric actuator according to claim 4, wherein pairs of the plurality of light emitting diodes are connected to a switching control section.

7. The driver of the piezoelectric actuator according to claim 3, wherein the switching mechanism includes a plurality of transistors to control the drive voltage.

8. The driver of the piezoelectric actuator according to claim 4, wherein when the plurality of light emitting diodes are combined with the plurality of phototransistors, an insulating state between the feeder line and controller is easily formed.

9. The driver of the piezoelectric actuator according to claim 4, wherein joints of pairs of the plurality of phototransistors are connected to common terminals of the plurality of piezoelectric actuators.

* * * * *